(12) United States Patent
Arai et al.

(10) Patent No.: US 8,421,087 B2
(45) Date of Patent: Apr. 16, 2013

(54) SEMICONDUCTOR MODULE INCLUDING A SWITCH AND NON-CENTRAL DIODE

(75) Inventors: Kiyoshi Arai, Tokyo (JP); Gourab Majumdar, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/311,762

(22) Filed: Dec. 6, 2011

(65) Prior Publication Data

US 2012/0074428 A1   Mar. 29, 2012

Related U.S. Application Data

(63) Continuation of application No. 12/543,779, filed on Aug. 19, 2009, now Pat. No. 8,168,985.

(30) Foreign Application Priority Data

Nov. 27, 2008   (JP) ................................. 2008-302225

(51) Int. Cl.
*H01L 25/07* (2006.01)
*H01L 25/18* (2006.01)
*H01L 29/12* (2006.01)

(52) U.S. Cl.
USPC ............. 257/77; 257/181; 257/288; 257/341; 257/356; 257/E25.027; 257/E21.614; 257/E29.327; 257/E29.068; 257/E27.009

(58) Field of Classification Search .................... 257/77, 257/E27.009
See application file for complete search history.

(56) References Cited

U.S. PATENT DOCUMENTS 6,529,062 B2   3/2003   Majumdar et al.

2002/0043708 A1   4/2002   Muto et al.
2002/0047132 A1   4/2002   Fukada et al.
2003/0155644 A1*  8/2003   Hirao et al. .................... 257/706
2009/0140289 A1*  6/2009   Torii ............................. 257/143
2010/0148718 A1   6/2010   Kitabatake et al.

FOREIGN PATENT DOCUMENTS

| DE | 103 01 091 A1 | 7/2004 |
|---|---|---|
| EP | 1 909 325 A1 | 4/2008 |
| JP | 2000-164800 | 6/2000 |
| JP | 2002-208673 | 7/2002 |
| JP | 2003-243612 | 8/2003 |
| JP | 2004-95670 | 3/2004 |

(Continued)

OTHER PUBLICATIONS

Majumdar, Gourab; Recent technologies and trends of power devices; Physics of Semiconductor Devices, 2007. IWPSD 2007; Issue date Dec. 16-20, 2007; pp. 787-792.*

Japanese Office Action issued Apr. 26, 2011, in Patent Application No. 2008-302225 (with English-language translation).

(Continued)

*Primary Examiner* — N Drew Richards
*Assistant Examiner* — John P Dulka
(74) *Attorney, Agent, or Firm* — Oblon, Spivak, McClelland, Maier & Neustadt, L.L.P.

(57) ABSTRACT

A semiconductor module having one or more silicon carbide diode elements mounted on a switching element is provided in which the temperature rise is reduced by properly disposing each of the diode elements on the switching element, to thereby provide a thermal dissipation path for the respective diode elements. The respective diode elements are arranged on a non-central portion of the switching element, to facilitate dissipation of the heat produced by each of the diode elements, whereby the temperature rise in the semiconductor module is reduced.

8 Claims, 7 Drawing Sheets

FOREIGN PATENT DOCUMENTS

| | | |
|---|---|---|
| JP | 2005-5593 | 1/2005 |
| JP | 2007-27403 | 2/2007 |
| JP | 2009-99663 | 5/2009 |
| WO | WO 2007010646 A1 * | 1/2007 |
| WO | WO 2007013367 A1 | 2/2007 |

OTHER PUBLICATIONS

Office Action issued Aug. 20, 2012 in Germany Patent Application No. 10 2009 043 441.0, with English translation.

* cited by examiner

SEMICONDUCTOR MODULE INCLUDING A SWITCH AND NON-CENTRAL DIODE

CROSS-REFERENCE TO RELATED APPLICATIONS

This application is a continuation of U.S. patent application Ser. No. 12/543,779, filed Aug. 19, 2009, and claims priority to Japanese patent application No. 2008-302225, filed Nov. 27, 2008. The entire contents of U.S. patent application Ser. No. 12/543,779 are incorporated herein by reference.

FIELD OF THE INVENTION

The present invention relates to semiconductor modules for use in power conversion apparatuses such as inverters, and particularly to an arrangement of semiconductor elements inside the semiconductor modules.

BACKGROUND OF THE INVENTION

Figure 13:
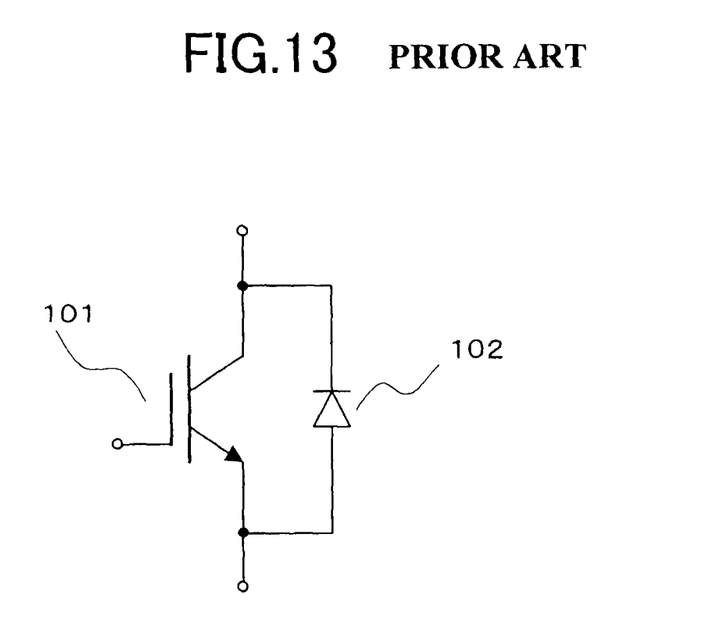
FIG. 13 is a diagram of a circuit including a diode element and an IGBT element for use in the semiconductor module such as an inverter.

A semiconductor module for use in a power conversion apparatus such as an inverter includes a circuit, as shown in FIG. 13, formed by the combination of a switching element such as an IGBT (insulated gate bipolar transistor) 101 and a diode element 102.

To satisfy the need in recent years for reducing the size of such a semiconductor module, a semiconductor module formed by providing a diode element on a switching element has been proposed in, for instance, Japanese Unexamined Patent Application Publication No. 2000-164800 (paragraph 0019, FIG. 2).

However, when a diode element that includes silicon as a material (hereinafter called silicon diode element) is provided on a switching element that includes as a material conventionally and commonly used silicon (hereinafter called silicon switching element), both switching element and diode element need substantially the same electric current density. For this reason, the silicon diode element becomes large enough to substantially cover the whole of the silicon switching element, thus making it difficult to draw electric current out of the silicon switching element.

To this end, another semiconductor module is proposed in which a diode element that includes, as a material, silicon carbide capable of increasing the electric current density and reducing the size of the diode element (hereinafter called silicon carbide diode element), is provided on the silicon switching element.

For example, Japanese Unexamined Patent Application Publication No. 2004-95670 (paragraph 0079, FIG. 6) discloses a semiconductor module formed by directly providing a silicon carbide diode chip in the middle portion of a silicon semiconductor element or chip, which portion is on the emitter side of the element or chip.

Furthermore, Japanese Unexamined Patent Application Publication No. 2003-243612 (paragraphs 0019, and 0029; FIG. 1) discloses another module formed by providing on a silicon semiconductor switching chip a wide gap semiconductor, such as a the silicon carbide diode chip, having a greater energy band gap than that of silicon.

In the respective semiconductor modules as described above, an attempt to achieve a size reduction in semiconductor module is made by providing a silicon carbide diode element on a silicon switching element. However, the mere provision of the silicon carbide diode element on the silicon switching element does not provide a good thermal dissipation path for the silicon carbide diode element, thus causing heat produced by the diode element not to be dissipated but to be built up, which poses a problem of excessive temperature rise in the semiconductor module. The problem becomes significant in the case of an increased electric current density.

SUMMARY OF THE INVENTION

The present invention is directed to overcome the above-described problem with thermal dissipation from the above-described silicon carbide diode element, and an object thereof is to provide a semiconductor module with a reduced temperature rise, by properly locating the silicon carbide diode element on a silicon switching element to thereby provide a thermal dissipation path for the silicon carbide diode element.

The feature of the present invention is that a semiconductor module includes a switching element(s), and a silicon carbide diode element(s) provided in a non-central portion of the silicon switching element—i.e., in a portion or at a position spaced away from the central portion of the switching element.

According to the present invention, a semiconductor module in which its temperature rise is reduced can be provided through reduction of the temperature rise due to heat produced by the silicon carbide diode element(s). These and other features, advantages and objects of the present invention will be further understood and appreciated by those skilled in the art by reference to the following drawings.

DESCRIPTION OF THE PREFERRED EMBODIMENTS

Embodiment 1

Figure 1:
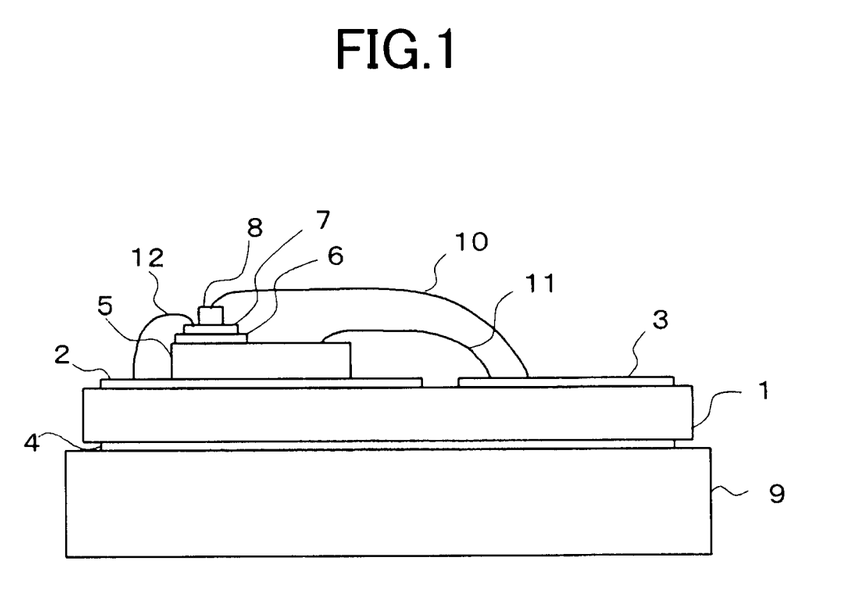
FIG. 1 is a side view illustrating a semiconductor module according to Embodiment 1 of the present invention.

FIG. 1 is a side view illustrating a semiconductor module according to Embodiment 1 of the present invention.

On the surface of an insulation substrate 1 formed of aluminum nitride or the like having high thermal conductivity and high electrical insulation are provided a collector film 2 and an emitter film 3, made of metal such as copper, while on the bottom surface thereof is provided a metal film 4 made of copper or the like.

A silicon IGBT element 5 serving as a silicon switching element is provided on the collector film 2, and both element 5 and film 2 are joined together by solder. In the present case, the collector of the silicon IGBT element 5 is joined with the collector film 2. This establishes an electrical connection between the collector of the silicon IGBT element 5 and the collector film 2.

Furthermore, an insulation film 6 formed of aluminum nitride or the like having high thermal conductivity and high electrical insulation is provided on the emitter of the silicon IGBT element 5, and is joined by solder to the emitter of the element 5. In the present case, the insulation film 6 is provided on the non-central portion of the silicon IGBT element 5.

Moreover, on the insulation film is provided a cathode film 7 made of metal such as copper.

Also, a silicon carbide diode element 8 is provided on the cathode film 7, and is joined by solder with the film 7. This establishes an electrical connection between the cathode of the silicon carbide diode element 8 and the cathode film 7. Here, preferably, a silicon carbide Schottky barrier diode (SiC-SBD) is used for the silicon carbide diode element 8.

In addition, a base substrate 9 made of metal such as copper is provided on the metal film 4 opposite the insulation substrate 1, and is joined by solder with the metal film 4. The base substrate 9 and the insulation substrate 1 act as a heat dissipater that dissipates heat from the semiconductor elements.

Further, there are provided a first wire 10, a second wire 11 and a third wire 12 each serving as a current input output portion—i.e., a conductor through which electric current flows into or from the silicon IGBT element 5 and the silicon carbide diode element 8. One end of the first wire 10 is joined with an anode of the silicon carbide diode element 8 and the other end thereof, with the emitter film 3. One end of the second wire 11 is joined with an emitter of the silicon IGBT element 5 and the other end thereof, with the emitter film 3. One end of the third wire 12 is joined with a cathode film and the other end thereof, with the collector film 2. Here, the first wire 10, the second wire 11 and the third wire 12 each includes, as a material, metal such as aluminum (Al) and gold (Au).

Figure 2:
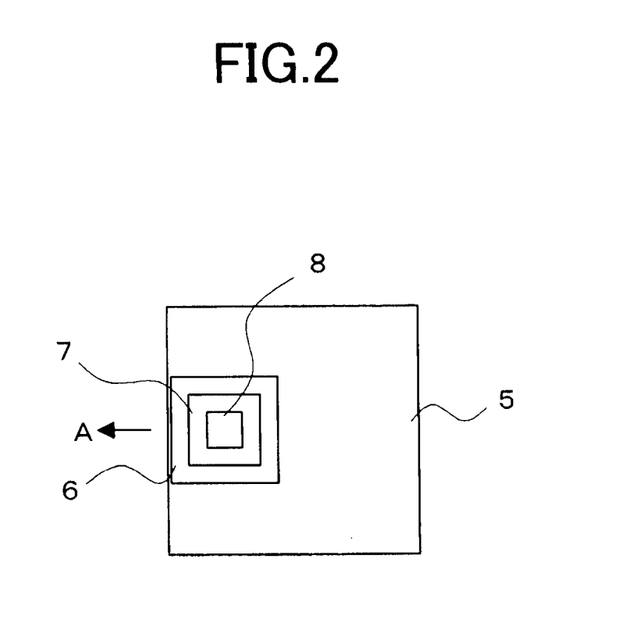
FIG. 2 is a fragmentary top plan view illustrating the semiconductor module according to Embodiment 1 of the present invention.
Figure 3:
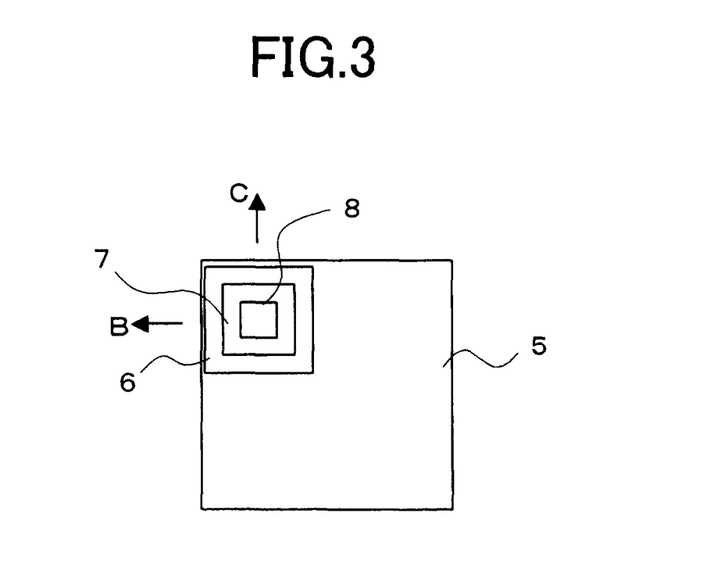
FIG. 3 is another fragmentary top plan view illustrating a semiconductor module according to Embodiment 1 of the present invention.

FIGS. 2 and 3 are fragmentary top plan views of the semiconductor module according to Embodiment 1 of the present invention, each illustrating a detailed arrangement of the insulation film 6, cathode film 7 and silicon carbide diode element 8 with respect to the silicon IGBT element 5.

The insulation film 6, the cathode film 7 and the silicon carbide diode element 8 are provided in such a manner that the silicon carbide diode element 8 is placed on the non-central portion of the silicon IGBT element 5, as is shown in FIGS. 2 and 3.

In this way, in the semiconductor module according to Embodiment 1, placing the silicon carbide diode element 8 on the non-central portion of the silicon IGBT element 5 facilitates heat dissipation from the silicon diode element 8. Consequently, a temperature rise due to heat produced by the silicon carbide diode element 8 can be reduced, which in turn reduces the temperature rise in the semiconductor module.

Here, FIGS. 2 and 3 each depict the silicon IGBT element 5 in the case of rectangular-shaped one that is typically used.

In this manner, when the silicon IGBT element 5 is rectangular-shaped, the silicon diode element 8 is disposed, as shown in FIG. 2, in close proximity to a side of the non-central portion of the rectangular shaped silicon IGBT element 5, whereby heat dissipation from the silicon carbide diode element 8 is facilitated in the direction indicated by arrow A. Thus, the temperature rise in the silicon carbide diode element 8 can be reduced, which, in turn, results in reduction in the temperature rise in the semiconductor module.

Alternatively, provision of the silicon carbide diode element 8, as shown in FIG. 3, on a corner of the rectangular-shaped silicon IGBT element 5 facilitates heat dissipation from the silicon diode element 8 along the directions indicated by arrows B and C. Thus, this arrangement enables the temperature rise in the silicon carbide diode element 8 to be reduced further than by positioning the diode element 8 in close proximity to a side of the rectangular-shaped silicon IGBT element 5, which results in further reduction in the temperature rise in the semiconductor module.

In Embodiment 1, a single silicon carbide diode element 8 is located on the non-central portion of the silicon IGBT element 5; further, a method of enhancing heat dissipation from the silicon carbide diode element is to dispose a plurality of silicon carbide diode elements on the non-central portion of the silicon IGBT element 5, whereby the temperature rise in the silicon carbide diode element can be reduced further than that shown in Embodiment 1. A case of using a plurality of silicon carbide diode element will be described below.

Embodiment 2

Figure 4:
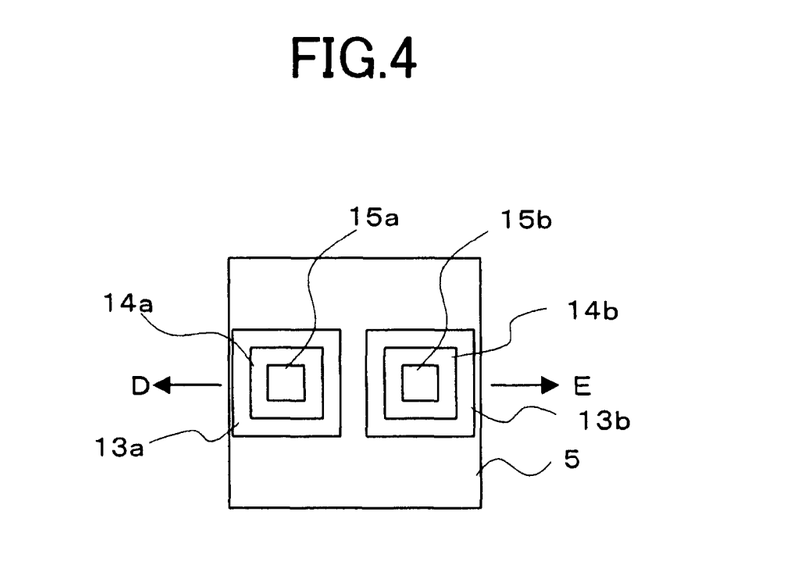
FIG. 4 is a fragmentary top plan view illustrating a semiconductor module according to Embodiment 2 of the present invention.
Figure 5:
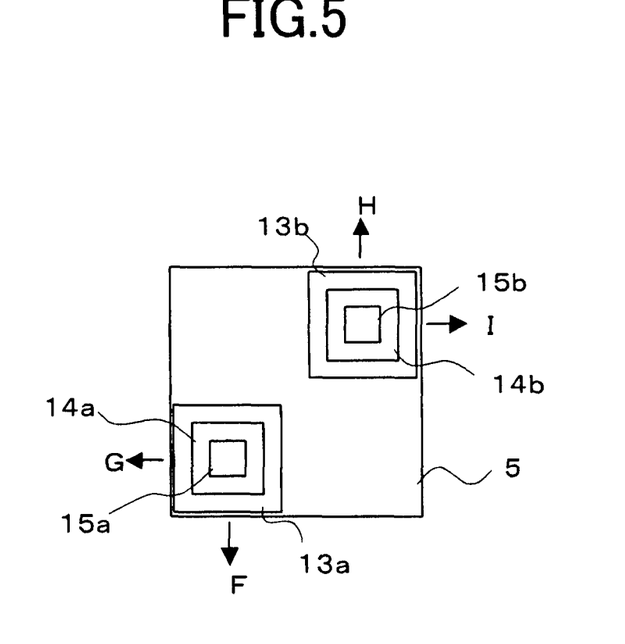
FIG. 5 is another fragmentary top plan view illustrating the semiconductor module according to Embodiment 2 of the present invention.

Embodiment 2 according to the present invention, where a plurality of silicon diode elements are used, is such that two silicon carbide diode elements are disposed on a non-central portion of the silicon IGBT element 5.

FIGS. 4 and 5 are fragmentary views of top plans of a semiconductor module according to Embodiment 2 of the present invention, each showing detailed arrangements of insulation films 13a, 13b, cathode films 14a, 14b, and silicon carbide diode elements 15a, 15b, on the silicon IGBT element 5. As is shown in FIGS. 4 and 5, the insulation films 13a, 13b, the cathode films 14a, 14b and the silicon carbide diode elements 15a, 15b are provided in such a manner that the diode elements 15a, 15b are positioned on the non-central portion of the IGBT element 5.

FIG. 1 illustrating Embodiment 1 can be used as the side view of the module according to Embodiment 2. The configuration of the semiconductor module according to Embodiment 2 corresponds to a configuration where, in FIG. 1, the insulation film 6 is replaced with the insulation films 13a, 13b; the cathode film 7, with the cathode films 14a, 14b; and the silicon carbide diode element 8, with the silicon carbide diode elements 15a, 15b.

Describing in greater detail the configuration, the insulation films 13a, 13b, made of aluminum nitride, are provided on the emitter of the silicon IGBT element 5 and joined by solder with the emitter thereof, and in the present case, the films 13a, 13b are provided on the non-central portion of the element 5.

Next, on the insulation films 13a, 13b are provided the cathode film 14a, 14b, each made of metal such as copper.

Finally, the silicon carbide diode element 15a is provided on the cathode film 14a and joined by solder with the film 14a; the silicon carbide diode element 15b is provided on the cathode film 14b and joined by solder with the film 14b. In the present case, the cathodes of the silicon carbide diode elements 15a, 15b are joined with the corresponding cathode films. This causes the cathodes of the diode element 15a, 15b to electrically connect to the cathode films 14a, 14b, respectively. Here, preferably, the silicon carbide Schottky barrier diode is utilized as the silicon carbide diode element 15a, 15b.

In addition, although not illustrated herein, the semiconductor module in Embodiment 2 uses as the input output portion (conductor) the first wire 10, the second wire 11 and the third wire 12. One end of each first wire 10 is joined with an anode of each of the silicon carbide diode elements 15a, 15b and the other end thereof, with the emitter film 3. One end of the second wire 11 is joined with an emitter of the silicon IGBT element 5 and the other end thereof, with the emitter film 3. One end of each third wire 12 is joined with each of the cathode films 14a, 14b and the other end thereof, with the collector film 2.

Because configurations of other elements correspond to those in FIG. 1 illustrating Embodiment 1, they will not be provided herein.

In this way, with the semiconductor module according to Embodiment 2, where a plurality of the diode elements is used, positioning the two silicon carbide diode elements 15a, 15b on the non-central portion of the silicon IGBT element 5 facilitates heat dissipation from the silicon diode element 8. In addition, the use of two silicon carbide diode elements allows electric current density borne by a single silicon carbide diode element to lower, thus reducing the volume of heat produced by the single diode element. Consequently, the temperature rise due to heat produced by the silicon carbide diode element can be reduced further than by using one silicon carbide diode element. This embodiment can further reduce the temperature rise in the semiconductor module in comparison with Embodiment 1.

Here, FIGS. 4 and 5 illustrate the silicon IGBT element 5 that is commonly used rectangular-shaped one.

In this way, when the silicon IGBT element 5 is rectangular-shaped, the silicon diode elements 15a, 15b are disposed, as shown in FIG. 4, in close proximity to two sides of the non-central portion of the rectangular shaped silicon IGBT element 5, whereby heat dissipation of the silicon carbide diode elements 15a, 15b is facilitated along the directions indicated by arrows D, E in FIG. 4. In addition, the use of two silicon carbide diode elements permits reduction of the electric current density borne by a single silicon carbide diode element. Hence, the temperature rise in the silicon carbide diode elements 15a, 15b is reduced further than by using a single silicon carbide diode element. In the present case, the temperature rise in the module can be reduced further than that shown in Embodiment 1.

Further, as shown in FIG. 5, the provision of the silicon carbide diode elements 15a, 15b on a corner (non-central portion) of the rectangular-shaped silicon IGBT element 5 facilitates, along the directions indicated by arrows F, G, H and I, the heat dissipation from the silicon diode elements 15a, 15b. Thus, this arrangement enables the temperature rise in the silicon carbide diode elements 15a, 15b to be reduced further than by positioning the diode element 8 in close proximity to two sides of the rectangular-shaped silicon IGBT element 5, which results in further reduction in the temperature rise in the semiconductor module.

Embodiment 3

In Embodiment 2 according to the present invention in which a plurality of silicon diode elements are used, it is shown that two silicon carbide diode elements 15a, 15b are disposed on a non-central portion of the silicon IGBT element 5. In Embodiment 3, four silicon carbide diode elements are arranged on the non-central portion thereof.

Figure 6:
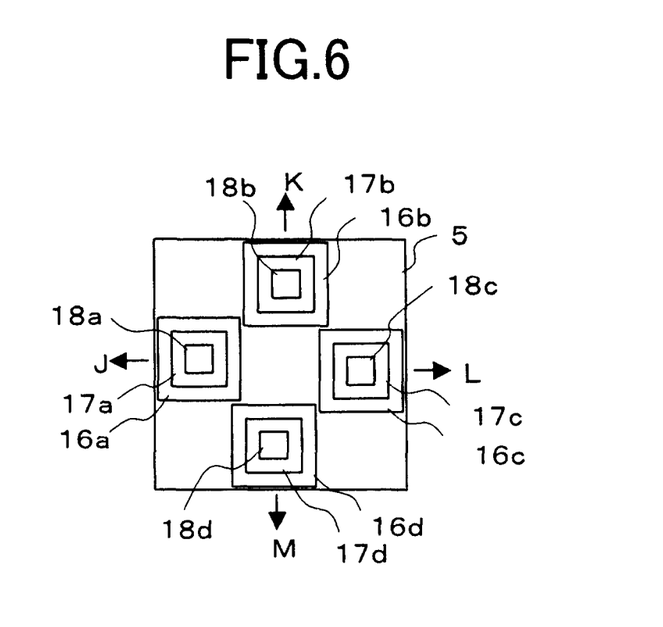
FIG. 6 is a fragmentary top plan view illustrating a semiconductor module according to Embodiment 3 of the present invention.
Figure 7:
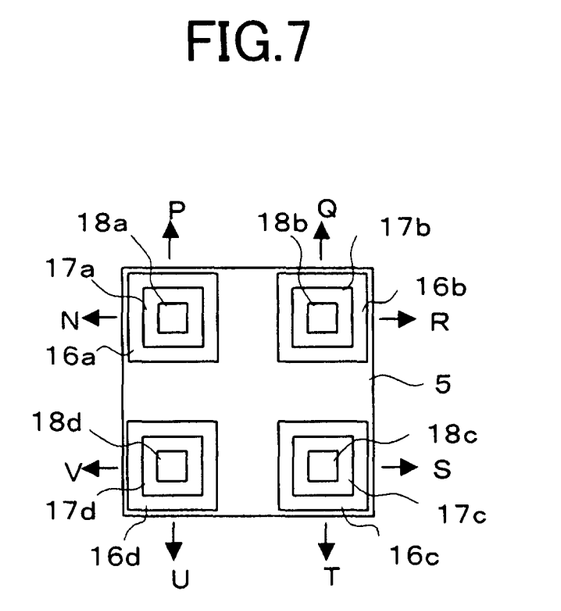
FIG. 7 is another fragmentary top plan view illustrating the semiconductor module according to Embodiment 3 of the present invention.

FIGS. 6 and 7 are fragmentary views of top plans illustrating a semiconductor module according to Embodiment 3 of the present invention, each depicting an detailed arrangement of the insulation films 16a-16d, the cathode films 17a-17d and the silicon carbide diode elements 18a-18d, on the silicon IGBT element 5. The insulation films 16a-16d, the cathode films 17a-17d and the silicon carbide diode elements 18a-18d are provided in such a manner that the diode elements 18a-18d are placed on the non-central portion of the silicon IGBT element 5, as is shown in FIGS. 6 and 7.

FIG. 1 illustrating Embodiment 1 can be used as the side view of the module according to Embodiment 3. The configuration of the semiconductor module according to Embodiment 3 corresponds to a configuration where, in FIG. 1, the insulation film 6 is replaced with the insulation films 16a-16d; the cathode film 7, with the cathode films 17a-17d; and the silicon carbide diode element 8, with the silicon carbide diode elements 18a-18d.

Describing in greater detail the configuration, the insulation films 16a-16d made of aluminum nitride are provided on the emitter of the silicon IGBT element 5, and are joined by solder with the emitter thereof, and in the present case the insulation films 16a-16d are provided on the non-central portion of the element 5.

Further, on the insulation films 16a-16d are provided the cathode films 17a-17d each made of metal such as copper.

The silicon carbide diode element 18a-18d are provided on the cathode films 17a-17d, respectively and are joined by solder with the respective films 17a-17d. In the present case, the cathodes of the silicon carbide diode elements 18a-18d are joined with the corresponding cathode films. This establishes electrical connections between the cathodes of the silicon carbide diode elements 18a-18d and the corresponding cathode films 17a-17d. Here, preferably, the silicon carbide Schottky barrier diode is utilized as the silicon carbide diode element 18a, 18b.

In addition, although not illustrated herein, the semiconductor module in Embodiment 3 uses as the input output portion (conductor) the first wire 10, the second wire 11 and the third wire 12. One end of each of the first wires 10 is joined with an anode of each of the silicon carbide diode elements 18a-18d and the other end of each thereof, with the emitter film 3. One end of the second wire 11 is joined with an emitter of the silicon IGBT element 5 and the other end thereof, with the emitter film 3. One end of each of the third wires 12 is joined with each of the cathode films 17a-17d and the other end of each thereof, with the collector film 2.

Because configurations of other elements correspond to those shown in FIG. 1 in Embodiment 1, they will not be provided herein.

In this way, in the semiconductor module according to Embodiment 3 where a plurality of the diode elements are used, placement of the four silicon carbide diode elements 18a-18d on the non-central portion of the silicon IGBT element 5 facilitates heat dissipation from the silicon carbide diode elements 18a-18d. In addition, the use of four silicon carbide diode elements allows electric current density borne by a single silicon carbide diode element to lower, thus reducing the volume of heat produced by the single diode element. Consequently, the temperature rise due to heat produced by the silicon carbide diode element can be reduced further than by using two silicon carbide diode elements. In the present case, the temperature rise in the semiconductor module can be reduced further than that shown in Embodiment 2.

Here, FIGS. 6 and 7 illustrate the silicon IGBT element 5 that is commonly used rectangular-shaped one.

In this way, when the silicon IGBT element 5 is rectangular-shaped, the silicon diode elements 18a-18d are disposed, as shown in FIG. 6, in close proximity to four sides of the non-central portion of the rectangular shaped silicon IGBT element 5, whereby the heat dissipation from the silicon carbide diode elements 18a-18d is facilitated along the directions indicated by arrows J, K, L and M in FIG. 6. In addition, the use of four silicon carbide diode elements allows electric current density borne by a single silicon carbide diode element to lower. Hence, the temperature rise in the silicon carbide diode elements 18a-18d is reduced further than by using two silicon carbide diode elements. In the present case, the temperature rise in the module can be reduced further than that shown in Embodiment 2.

Further, as shown in FIG. 7, the silicon carbide diode elements 18a-18d are located on the four corners (non-central portion) of the rectangular shaped silicon IGBT element 5, whereby heat dissipation from the silicon carbide diode elements 18a-18d is facilitated along the directions indicated by arrows N, P, Q, R, S, T, U and V in FIG. 7. For this reason, the temperature rise in the silicon carbide diode element can be reduced further than by disposing the silicon diode elements 18a-18d in close proximity to the four sides of the rectangular shaped silicon IGBT element 5. As a result, the temperature rise in the module can be further reduced.

Embodiment 4

Figure 8:
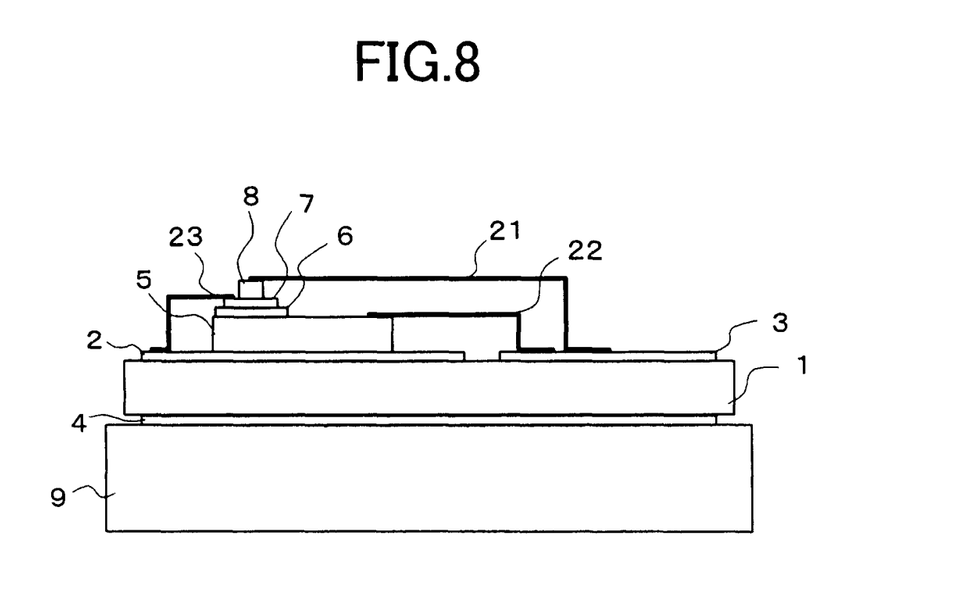
FIG. 8 is a side view illustrating a semiconductor module according to Embodiment 4 of the present invention.

In Embodiment 1, it is shown that the first wire 10, the second wire 11 and the third wire 12 are employed as the input output portion (conductor) through which electric current flows into or from the silicon IGBT element 5 and the silicon carbide diode element 8. In Embodiment 4 of the present invention, the first wire 10, the second wire 11 and the third wire 12 are replaced with a first lead strip 21, a second lead strip 22 and a third lead strip 23 each made of metal such as copper. Because configurations of other elements correspond to those shown in FIG. 1 in Embodiment 1, they will not be provided herein.

In this way, in the semiconductor module according to Embodiment 4, the use of the first lead strip 21, the second lead strip 22 and the third lead strip 23 facilitates heat dissipation from the semiconductor elements by way of the lead strips. In particular, since the first lead strip 21 and the third lead strip 23 contribute to heat dissipation from the silicon carbide diode element 8 whose temperature tends to rise, the temperature rise in the diode element 8 can be reduced. Further, because the second lead strip 22 contributes to heat dissipation from the silicon IGBT element 5, the temperature rise in the IGBT element 5 can be reduced. In the present case, the temperature rise in the semiconductor modules can be reduced further than that shown in Embodiment 1.

Further, the first lead strip 21, the second lead strip 22 and the third lead strip 23, as described in the present embodiment, is applicable to Embodiment 2 as well. In that case, the semiconductor module uses as the input output portion (conductor) the first lead strip 21, the lead strip 22 and the third lead strip 23. One end of each of the first lead strips 21 is joined with an anode of each of the silicon carbide diode elements 15a, 15b and the other end of each thereof, with the emitter film 3. One end of the second lead strip 22 is joined with an emitter of the silicon IGBT element 5 and the other end thereof, with the emitter film 3. One end of each of the third lead strips 23 is joined with each of the cathode films 14a, 14b and the other end of each thereof, with the collector film 2.

With this arrangement, the temperature rise due to heat produced by the silicon carbide diode elements 15a, 15b whose temperature particularly tends to rise, can be reduced. In the present case, the temperature rise in the semiconductor modules can be reduced further than that shown in Embodiment 2.

Further, the first lead strip 21, the second lead strip 22 and the third lead strip 23, as described in the present embodiment, are applicable to Embodiment 3 as well. In that case, the semiconductor module uses as the input output portion (conductor) the first lead strip 21, the lead strip 22 and the third lead strip 23. One end of each of the first lead strips 21 is joined with an anode of each of the silicon carbide diode elements 18a-18d and the other end of each thereof, with the emitter film 3. One end of the second lead strip 22 is joined with an emitter of the silicon IGBT element 5 and the other end thereof, with the emitter film 3. One end of each of the third lead strips 23 is joined with each of the cathode films 17a-17d of the corresponding silicon carbide diode elements 18a-18d and the other end of each thereof, with the collector film 2.

This arrangement enables reduction in the temperature rise due to heat produced by the silicon carbide diode elements 18a, 18b whose temperature particularly tends to rise. In the present case, the temperature rise in the semiconductor elements can be reduced further than that shown in Embodiment 3.

In Embodiment 1 through Embodiment 4, since the temperature rise due to heat produced by the silicon carbide diode elements 8, 15a, 15b and 18a-18d, is reduced, the material for the insulation films 6, 13a, 13b and 16a-16d can be changed from aluminum nitride to less-expensive epoxy resin. This change allows for reduction in manufacture/fabrication cost of the semiconductor module.

In Embodiment 1 through Embodiment 4, it is shown that the silicon carbide diode elements 8, 15a, 15b and 18a-18d are arranged on the non-central portion of the silicon IGBT element 5, and corresponding to this arrangement, the insulation films 6, 13a, 13b and 16a-16d, and the cathode film 7, 14a, 14b and 17a-17d are also arranged on the non-central portion thereof. The insulation films and the cathode films, however, do not need to be split. For instance, the insulation film 6 and the cathode film 7, as shown in FIG. 1 illustrating Embodiment 1, may be provided on the entire surface of the emitter of the silicon IGBT element 5, with the silicon carbide diode elements 8, 15a, 15b and 18a-18d each being provided on a portion of the cathode film 7 located in the non-central portion of the IGBT element 5.

Figure 9:
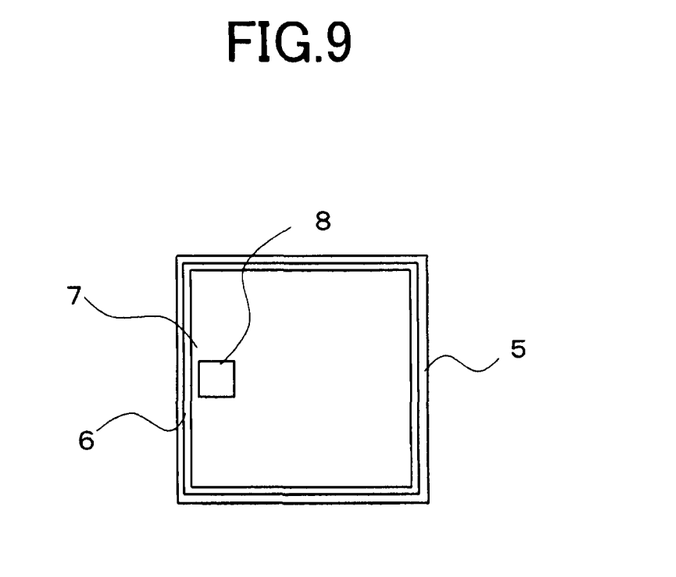
FIG. 9 is a fragmentary top plan view illustrating another example of a configuration of a semiconductor module according to Embodiment 1 of the present invention.

FIG. 9 is a fragmentary top plan view showing an example of providing the insulation film 6, and the cathode film 7 on the entire surface of the emitter of the silicon IGBT element 5, based on FIG. 2 illustrating Embodiment 1. As shown in FIG. 9, the insulation film 6 is provided on substantially the entire surface of the emitter of the silicon IGBT element 5, and also the cathode film 7 on substantially the entire surface of the insulation film 6. The silicon carbide diode element 8 is joined with a portion of the cathode film 7 corresponding to the non-central portion of the silicon IGBT element 5. In this situation, each of the insulation film 6 and the cathode 7 needs to partially be removed at a place where the wire or the lead strip is to be joined, and also at a place for the gate. It should be understood, as a matter of course, that the description illustrating FIG. 9 is applicable to Embodiment 2 through Embodiment 4.

Embodiment 5

Figure 10:
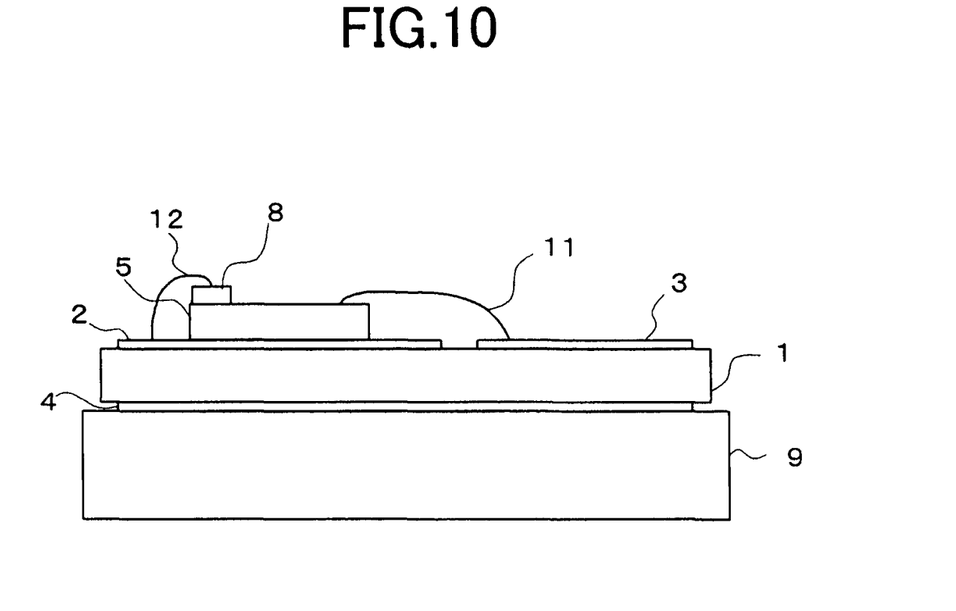
FIG. 10 is a side view illustrating a semiconductor module according to Embodiment 5 of the present invention.

FIG. 10 is a side view illustrating a semiconductor module according to Embodiment 5 of the present invention. The difference between FIG. 1 illustrating Embodiment 1 and FIG. 10 is that the anode of the silicon carbide diode element 8 is directly joined by solder or the like with the emitter of the silicon IGBT element 5. In the present case, the silicon carbide diode element 8 is placed upside down in comparison with that in FIG. 1 illustrating Embodiment 1. This arrangement causes the emitter of the IGBT element 5 to electrically connect with the anode of the diode element 8. Here, the same reference numerals refer to like elements in FIG. 1 (illustrating Embodiment 1) and FIG. 10, and no description of the corresponding elements will be provided herein.

This arrangement also eliminates the need for the insulation film 6, thus facilitating heat dissipation of the diode element 8 toward the IGBT element 5. Consequently, the temperature rise due to heat produced by the silicon carbide diode element 8 can be reduced further than by using the insulation film 6. In the present case, the temperature rise in the semiconductor module can be reduced further than that shown in Embodiment 1.

The insulation film 6 and the first wire 10 can be eliminated, thus reducing manufacture/fabrication cost for the semiconductor module. Further, the elimination of the first wire 10 provides an advantage of permitting a simplification in internal wiring of the module.

Here, the configuration, as shown in Embodiment 5, in which the anode of the diode element 8 is directly joined with the emitter of the IGBT element 5, can be made corresponding to that in Embodiment 2 in which a plurality of the diode elements is employed. In that case, the anodes of the diode elements 15a, 15b are directly joined with the emitter of the IGBT element 5.

This allows the temperature rise due to heat produced by the diode elements 15a, 15b to be reduced. In that case, the temperature rise in the semiconductor module can be reduced further than that shown in Embodiment 2.

Further, the configuration, as shown in Embodiment 5, in which the anode of the diode element 8 is directly joined with the emitter of the IGBT element 5, can be made corresponding to that in Embodiment 3 in which a plurality of the diode elements is used. In that case, the anodes of the silicon carbide diode elements 18a-18d are directly joined with the emitter of the silicon IGBT element 5.

This allows for reduction in the temperature rise due to heat produced by the silicon carbide diode elements 18a-18d. In that case, the temperature rise in the semiconductor module can be reduced further than that shown in Embodiment 3.

Embodiment 6

Figure 11:
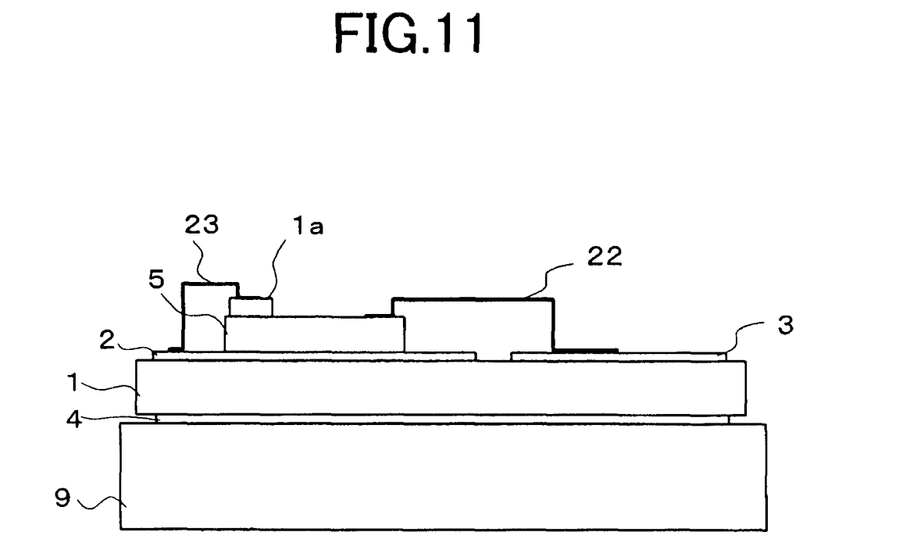
FIG. 11 is a side view illustrating a semiconductor module according to Embodiment 6 of the present invention.

FIG. 11 is a side view illustrating a semiconductor module according to Embodiment 6 of the present invention. The difference between FIG. 10 illustrating Embodiment 5 and FIG. 11 is that in place of the second wire 11 and the third wire 12, the second lead strip 22 serving as the current input output portion—i.e., a conductor through which electric current flows into or from the corresponding element—is used to connect the emitter of the silicon IGBT element 5 with the emitter film 3, and the third lead strip 23 serving as the current input output portion (conductor) is used to connect the cathode of the silicon carbide diode element 8 with the collector film 2. Here, the same reference numerals refer to like elements in FIG. 10 (illustrating Embodiment 5) and FIG. 11, and no description of the corresponding elements will be provided herein.

This arrangement eliminates, as is the case with Embodiment 5, the insulation film 6, which thus facilitates heat dissipation from the silicon carbide diode element 8 in the direction toward the silicon IGBT element 5 as well. In addition, the use of the second and third lead strips 22, 23 provides better heat dissipation for the module. Since especially the lead strip 23 contributes to heat dissipation of the silicon carbide diode element 8 whose temperature is prone to rise, the temperature rise in the diode element 8 can be reduced, while the lead strip 22 contributes to heat dissipation of the silicon IGBT element 5, the temperature rise in the IGBT element 5 can be reduced. In the present case, the temperature rise can be reduced further than that shown in Embodiment 5.

Moreover, elimination of the insulation film 6 and the first lead strip 21 allows for reduction in manufacture/fabrication cost of the semiconductor module. Further, the first lead strip 21 may be eliminated, thus providing an advantage in making internal wiring of the semiconductor module simple.

Further, the configuration shown in Embodiment 6—in which the anode of the silicon carbide diode element 8 is directly joined with the emitter of the silicon IGBT element 5, and also the second lead strip 22 and the third lead strip 23 are used—can be made corresponding to Embodiment 3 in which a plurality of silicon carbide diode elements is employed. In that case, the anodes of the silicon carbide diode element 15a, 15b are directly joined with the emitter of the silicon IGBT element 5. Further, one end of the second lead strip 22 is joined with the emitter of the silicon IGBT element 5 and the other end thereof, with the emitter film 3, while one end of the second lead strip 23 is joined with the cathode of the silicon carbide diode elements 15a, 15b, and the other end thereof, with the emitter film 2.

This arrangement allows for reduction in the temperature rise due to heat produced by the silicon carbide diode elements 15a, 15b whose temperature is particularly prone to rise. In that case, the temperature rise in the semiconductor module can be reduced further than that shown in Embodiment 5.

Further, the configuration shown in Embodiment 6—in which the anode of the silicon carbide diode element 8 is directly joined with the emitter of the silicon IGBT element 5, and also the second lead strip 22 and the third lead strip 23 are used—can be made corresponding to Embodiment 4 in which a plurality of silicon carbide diode elements is employed. In the present case, the anodes of the silicon carbide diode element 18a-18d are directly joined with the emitter of the silicon IGBT element 5. Further, one end of the second lead strip 22 is joined with the emitter of the silicon IGBT element 5 and the other end thereof, with the emitter film 3, while one end of the second lead strip 23 is joined with the cathode of the silicon carbide diode elements 18a-18d and the other end thereof, with the emitter film 2.

This arrangement permits reduction in the temperature rise due to heat produced by the silicon carbide diode elements 18a-18d whose temperature is particularly prone to rise. In that case, the temperature rise in the semiconductor module can be reduced further than that shown in Embodiment 5.

Figure 12:
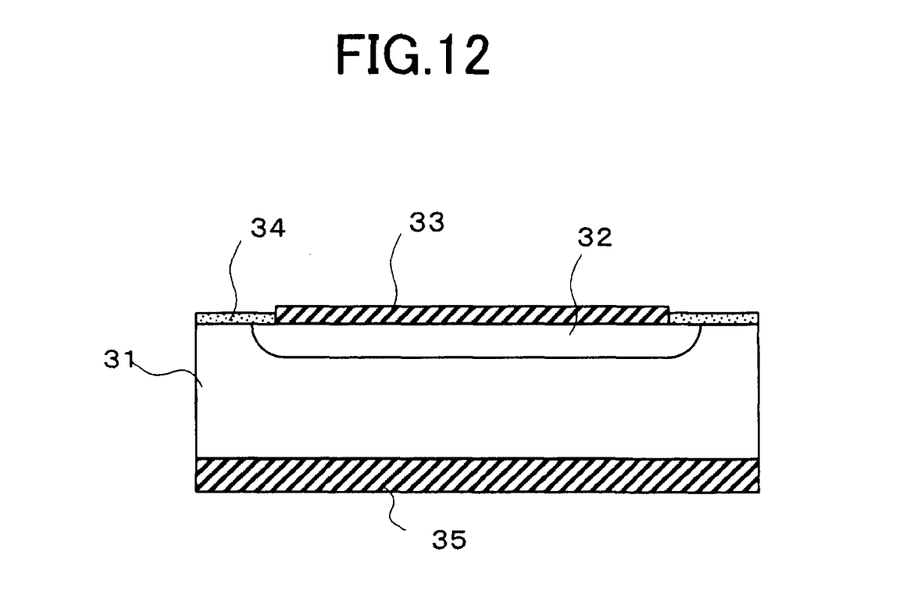
FIG. 12 is a cross-sectional view illustrating a silicon carbide diode element using a p-silicon carbide substrate according to Embodiment 1 through Embodiment 6.

Throughout all of the embodiments, the silicon carbide diode element fabricated using any one of an n-silicon carbide substrate or a p-silicon carbide substrate, may be employed. For Embodiment 5 and Embodiment 6, it is preferable to use the silicon carbide diode element fabricated by using the p-silicon carbide substrate on which entire surface an anode can be formed, as shown in FIG. 11. FIG. 12 shows an example of the silicon carbide diode element using such a p-silicon carbide substrate. In FIG. 12 are shown a p-silicon carbide substrate 31, an n-diffusion layer 32 formed within the surface of the p-silicon carbide substrate 31, a cathode 33 formed on the surface of the p-silicon carbide substrate 31, a protection film 34 formed on the surface of the p-silicon carbide substrate 31, including an area of its n-diffusion layer 32 located in the periphery of the cathode 33, and an anode 35 formed on the rear surface of the p-silicon carbide substrate 31.

While it is shown that all the embodiments use the IGBT element as the switching element, another type of the switching element such as, for instance, an MOSFET (metal oxide semiconductor field effect transistor) element, or a bipolar transistor element can be employed, which is within the scope of the invention.

In addition, the advantage attained by the present invention can be achieved by replacing the silicon switching element with the silicon carbide switching element using silicon carbide as a material. It should be appreciated that the scope of the present invention includes the use of the silicon switching element. While the present invention has been shown and described with reference to preferred embodiments thereof, it will be understood by those skilled in the art that various modifications and the like could be made thereto without departing from the spirit and scope of the invention.

What is claimed is:

1. A semiconductor module, comprising:
   a switching element including a top surface and a bottom surface opposing the top surface; and
   a silicon carbide diode element provided on a non-central portion of the top surface of the switching element, a bottom surface of the silicon carbide diode element facing the top surface of the switching element,
   wherein the switching element is rectangular-shaped and the silicon carbide diode element is provided directly on the top surface of the switching element in close proximity to a corner of the switching element, and
   the bottom surface of the switching element faces a top surface of an insulating substrate, and the top surface of the switching element is electrically connected to a metal film in contact with the top surface of the insulating substrate,
   wherein the top surface of the switching element is electrically connected with the bottom surface of the silicon carbide diode element.

2. The semiconductor module of claim 1, wherein an input output portion, through which electric current flows into or from the switching element and the silicon carbide diode element, is made of a lead strip.

3. The semiconductor module of claim 1, wherein the switching element is any one of a silicon IGBT element, a silicon carbide IGBT element, a silicon MOSFET element and a silicon carbide MOSFET element.

4. The semiconductor module of claim 1, wherein an emitter on the top surface of the switching element is electrically connected to the metal film in contact with the top surface of the insulating substrate.

5. A semiconductor module, comprising:
   a switching element including a top surface and a bottom surface opposing the top surface; and
   a silicon carbide diode element provided on a non-central portion of the top surface of the switching element, a bottom surface of the silicon carbide diode element facing the top surface of the switching element,
   wherein the switching element is rectangular-shaped and the silicon carbide diode element is provided directly on the top surface of the switching element in closer proximity to one corner of the rectangular-shaped switching element than the other three corners of the rectangular-shaped switching element, and
   the bottom surface of the switching element faces a top surface of an insulating substrate, and the top surface of the switching element is electrically connected to a film in contact with the top surface of the insulating substrate,
   wherein the top surface of the switching element is electrically connected with the bottom surface of the silicon carbide diode element.

6. The semiconductor module of claim 5, wherein an input output portion, through which electric current flows into or from the switching element and the silicon carbide diode element, is made of a lead strip.

7. The semiconductor module of claim 5, wherein the switching element is any one of a silicon IGBT element, a silicon carbide IGBT element, a silicon MOSFET element and a silicon carbide MOSFET element.

8. The semiconductor module of claim 5, wherein an emitter on the top surface of the switching element is electrically connected to the film in contact with the top surface of the insulating substrate.

* * * * *